(12) United States Patent
Chen et al.

(10) Patent No.: US 11,791,246 B2
(45) Date of Patent: *Oct. 17, 2023

(54) PACKAGE STRUCTURE WITH PHOTONIC DIE AND METHOD

(71) Applicant: Taiwan Semiconductor Manufacturing Company, Ltd., Hsinchu (TW)

(72) Inventors: Hsien-Wei Chen, Hsinchu (TW); Ming-Fa Chen, Taichung (TW); Ying-Ju Chen, Yunlin County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/725,562

(22) Filed: Apr. 21, 2022

(65) Prior Publication Data
US 2022/0246502 A1    Aug. 4, 2022

Related U.S. Application Data

(63) Continuation of application No. 16/836,926, filed on Apr. 1, 2020, now Pat. No. 11,315,855.

(51) Int. Cl.
*H01L 23/495*  (2006.01)
*H01L 21/768*  (2006.01)
(Continued)

(52) U.S. Cl.
CPC .. *H01L 23/49503* (2013.01); *H01L 21/76898* (2013.01); *H01L 23/49827* (2013.01);
(Continued)

(58) Field of Classification Search
CPC ......... H01L 23/49503; H01L 21/76898; H01L 23/49827; H01L 23/528; H01L 24/06; H01L 24/14; H01L 24/81; H01L 2224/08146; H01L 24/32; H01L 23/481; H01L 24/08; H01L 24/16; H01L 2224/02372; H01L 2224/0345; H01L 2224/03452; H01L 2224/0401;
(Continued)

(56) References Cited

U.S. PATENT DOCUMENTS 8,993,380 B2   3/2015   Hou et al.
9,281,254 B2   3/2016   Yu et al.
(Continued)

*Primary Examiner* — Patricia D Valenzuela
(74) *Attorney, Agent, or Firm* — JCIPRNET

(57) ABSTRACT

Provided is a package structure including a bottom die, a top die, an insulating layer, a circuit substrate, a dam structure, and an underfill. The top die is bonded on a front side of the bottom die. The insulating layer is disposed on the front side of the bottom die to laterally encapsulate a sidewall of the top die. The circuit substrate is bonded on a back side of the bottom die through a plurality of connectors. The dam structure is disposed between the circuit substrate and the back side of the bottom die, and connected to the back side of the bottom die. The underfill laterally encapsulates the connectors and the dam structure. The dam structure is electrically isolated from the circuit substrate by the underfill. A method of forming the package structure is also provided.

20 Claims, 15 Drawing Sheets

(51) Int. Cl.
  *H01L 23/528* (2006.01)
  *H01L 23/498* (2006.01)
  *H01L 23/00* (2006.01)
  *H01L 25/065* (2023.01)

(52) U.S. Cl.
  CPC ............ *H01L 23/528* (2013.01); *H01L 24/06* (2013.01); *H01L 24/13* (2013.01); *H01L 24/14* (2013.01); *H01L 24/81* (2013.01); *H01L 25/0657* (2013.01); *H01L 2224/08146* (2013.01)

(58) Field of Classification Search
  CPC . H01L 2224/05559; H01L 2224/05569; H01L 2224/05572; H01L 2224/05647; H01L 2224/08145; H01L 2224/11002; H01L 2224/13023; H01L 2224/16225; H01L 2224/26145; H01L 2224/32057; H01L 2224/32225; H01L 2224/73204; H01L 2224/73251; H01L 2224/80097; H01L 2224/80201; H01L 2224/81191; H01L 2224/83104; H01L 2224/9202; H01L 2224/94; H01L 2224/0239; H01L 2224/05157; H01L 2224/05166; H01L 2224/05181; H01L 2224/05184; H01L 2224/05186; H01L 2224/05624; H01L 2224/05639; H01L 2224/05644; H01L 2224/05655; H01L 2224/05684; H01L 2224/13099; H01L 2224/2612; H01L 2224/2929; H01L 2224/29386; H01L 2224/80379; H01L 2224/81399; H01L 2224/8349; H01L 2224/8359; H01L 2224/83688; H01L 25/0657; H01L 24/13; G02B 6/30; G02B 6/4274

See application file for complete search history.

(56) References Cited

U.S. PATENT DOCUMENTS

| | | |
|---|---|---|
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,461,018 B1 | 10/2016 | Tsai et al. |
| 9,496,189 B2 | 11/2016 | Yu et al. |
| 9,666,502 B2 | 5/2017 | Chen et al. |
| 9,735,131 B2 | 8/2017 | Su et al. |
| 11,315,855 B2 * | 4/2022 | Chen .................. H01L 24/06 |
| 2020/0006088 A1 * | 1/2020 | Yu .................... G02B 6/136 |

* cited by examiner

PACKAGE STRUCTURE WITH PHOTONIC DIE AND METHOD

CROSS-REFERENCE TO RELATED APPLICATION

This application is a continuation application of and claims the priority benefit of a prior application Ser. No. 16/836,926, filed on Apr. 1, 2020, now allowed. The entirety of the above-mentioned patent application is hereby incorporated by reference herein and made a part of this specification.

BACKGROUND

Electrical signaling and processing are one technique for signal transmission and processing. Optical signaling and processing have been used in increasingly more applications in recent years, particularly due to the use of optical fiber-related applications for signal transmission.

Optical signaling and processing are typically combined with electrical signaling and processing to provide full-fledged applications. For example, optical fibers may be used for long-range signal transmission, and electrical signals may be used for short-range signal transmission as well as processing and controlling. Accordingly, devices integrating optical components and electrical components are formed for the conversion between optical signals and electrical signals, as well as the processing of optical signals and electrical signals. However, a fabrication process of integrating the photonic die and the electronic die would face some challenges, such as optical transmission noise, optical loss, or the like.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
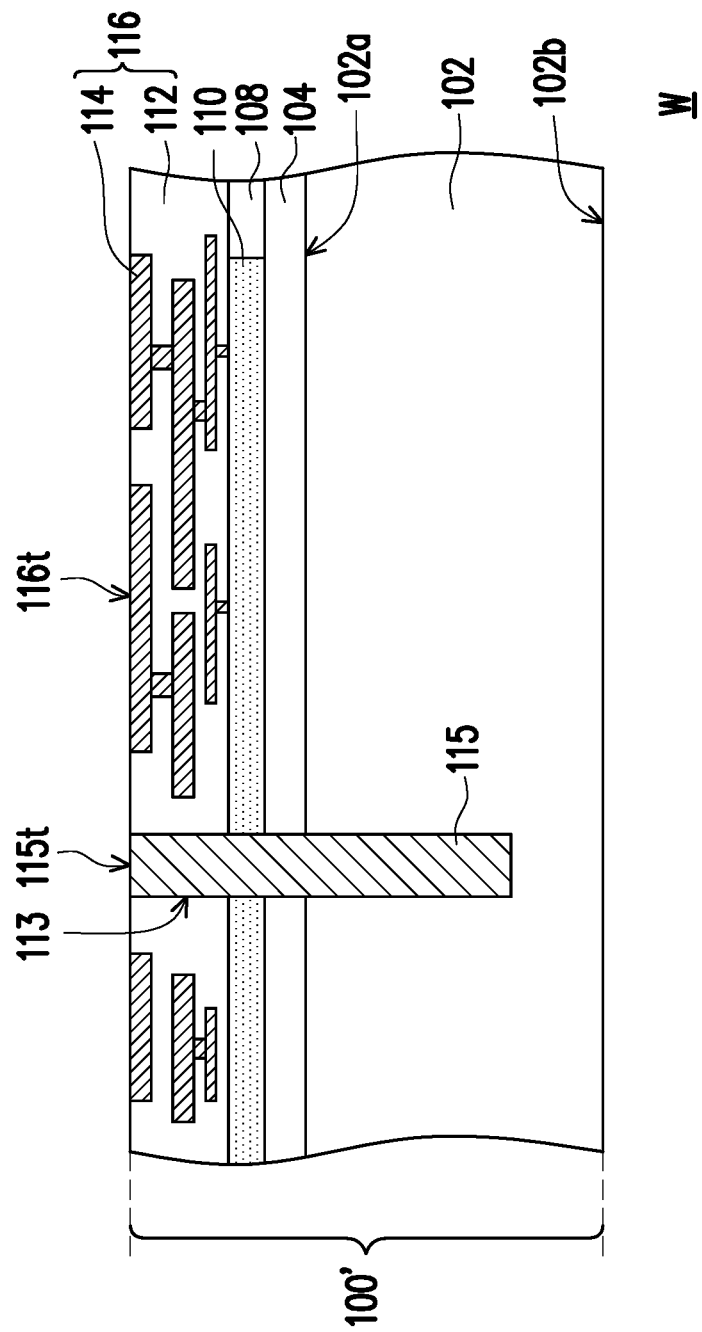
FIG. 1 to FIG. 6 are schematic cross-sectional views illustrating a process flow for fabricating a package structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

In accordance with some embodiments, a package structure including a die stack structure bonding onto a circuit substrate through a plurality of connectors is provided. Specifically, the die stack structure includes a photonic die and an electronic die bonding to each other. A conductive layer is disposed between the plurality of connectors and the photonic die. The conductive layer includes a plurality of conductive pads and a dam structure between the plurality of conductive pads and a first sidewall of the photonic die. When an underfill is injected at a second sidewall of the photonic die, the dam structure is able to prevent the underfill from climbing onto the first sidewall of the photonic die, especially a sidewall of a photonic transmission structure of the photonic die. In the case, no underfill is included in an optical path that an optical fiber is optically coupled to the photonic transmission structure, thereby improving the optical transmission noise between the photonic transmission structure and the optical fiber.

FIG. 1 to FIG. 6 are schematic cross-sectional views illustrating a process flow for fabricating a package structure in accordance with some embodiments of the present disclosure. FIG. 7A is a schematic cross-sectional view of a package structure in accordance with a first embodiment of the present disclosure. FIG. 7B is a schematic top view of the package structure illustrated in FIG. 7A. FIG. 7C is another schematic top view of the package structure illustrated in FIG. 7A.

Referring to FIG. 1, a photonic wafer W including a plurality of photonic integrated circuit regions 100' therein is provided. In some embodiments, the photonic integrated circuit regions 100' are arranged in array configuration and physically connected to one another. Specifically, one of the photonic integrated circuit regions 100' includes a substrate 102, a dielectric layer 104, a photonic transmission structure 110, a protection layer 108, a through substrate via (TSV) 115, and an interconnect structure 116.

As shown in FIG. 1, the substrate 102 has a first surface 102a and a second surface 102b opposite to each other. In some embodiments, the substrate 102 may be a material such as a glass, ceramic, dielectric, or a semiconductor substrate. For example, the substrate 102 may include a bulk semiconductor or the like, which may be doped (e.g., with a p-type or an n-type dopant) or undoped. In some embodiments, the substrate 102 is a wafer, such as a silicon wafer or other type of semiconductor wafer. Other substrate materials, such as a multi-layered or gradient substrate may also be used. In some embodiments, the material of the substrate 102 may include silicon, germanium, a compound semiconductor including silicon carbide, gallium arsenic, gallium phosphide, indium phosphide, indium arsenide, and/or indium antimonide, an alloy semiconductor including SiGe, GaAsP, AlInAs, AlGaAs, GaInAs, GaInP, and/or GaInAsP, the like, or combinations thereof.

As shown in FIG. 1, the dielectric layer 104 is formed on the first surface 102a of the substrate 102. In some embodiments, the dielectric layer 104 include an oxide layer, such as a silicon oxide layer. Next, the photonic transmission structure 110 is formed on the dielectric layer 104. In some embodiments, the photonic transmission structure 110 includes semiconductor devices and optical devices for processing the optical signal. For example, the semiconductor devices formed in the photonic transmission structure 110 may include transistors, capacitors, photodiodes or the combination thereof, and the optical devices formed in the photonic transmission structure 110 may include modulators, grating coupler, edge coupler, waveguides, filters or the combination thereof. In some alternative embodiments, the photonic transmission structure 110 may be referred to as an optical network to transmit optical signals. Thereafter, the protection layer 108 is formed to laterally encapsulate a sidewall of the photonic transmission structure 110. In some embodiments, the protection layer 108 include a dielectric material, such as silicon oxide.

As shown in FIG. 1, the interconnect structure 116 is formed on the photonic transmission structure 110 and the protection layer 108. In detail, the interconnect structure 116 includes an insulating material 112 and a plurality of metal features 114. The metal features 114 are formed in the insulating material 112 and electrically connected to the photonic transmission structure 110. In some embodiments, the insulating material 112 includes an inner-layer dielectric (ILD) layer on the photonic transmission structure 110, and at least one inter-metal dielectric (IMD) layer on the ILD layer. In some embodiments, the insulating material 112 includes silicon oxide, silicon nitride, silicon oxynitride, tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), low-k dielectric material, other suitable dielectric material, or combinations thereof. Exemplary low-k dielectric materials include FSG, carbon doped silicon oxide, Black Diamond® (Applied Materials of Santa Clara, Calif.), Xerogel, Aerogel, amorphous fluorinated carbon, Parylene, BCB, SiLK (Dow Chemical, Midland, Mich.), polyimide, other low-k dielectric material, or combinations thereof. In some alternatively embodiments, the insulating material 112 may be a single layer or multiple layers. In some embodiments, the metal features 114 include plugs and metal lines. The plugs may include contacts formed in the ILD layer, and vias formed in the IMD layer. The contacts are formed between and in connect with the photonic transmission structure 110 and a bottom metal line. The vias are formed between and in connect with two metal lines. The metal features 114 may be made of tungsten (W), copper (Cu), copper alloys, aluminum (Al), aluminum alloys, or a combination thereof. In some alternatively embodiments, a barrier layer (not shown) may be formed between the metal features 114 and the insulating material 112. A material of the barrier layer includes tantalum, tantalum nitride, titanium, titanium nitride, cobalt-tungsten (CoW) or a combination thereof, for example.

After forming the interconnect structure 116, the TSV 115 is formed to extend from the interconnect structure 116 downward into the substrate 102 without penetrating the substrate 102. In other words, the TSV 115 partially embedded in the substrate 102 are not exposed at the second surface 102b of the substrate 102. In some embodiments, the TSV 115 is formed by forming an opening 113 in the interconnect structure 116, the photonic transmission structure 110, the dielectric layer 104, and the substrate 102, filling a conductive material in the opening 113, and performing a planarization process on the conductive material to expose the interconnect structure 116. In the case, the TSV 115 has a top surface 115t flush with a top surface 116t of the interconnect structure 116. In addition, the TSV 115 further include an insulating layer and/or a barrier layer on a bottom surface and a sidewall of the opening 113 to separate the conductive material from the interconnect structure 116, the photonic transmission structure 110, the dielectric layer 104, and the substrate 102. Although only one TSV 115 is illustrated in FIG. 1, the disclosure is not limited thereto. In other embodiments, more than one TSVs are formed in the photonic integrated circuit regions 100'.

Figure 2:
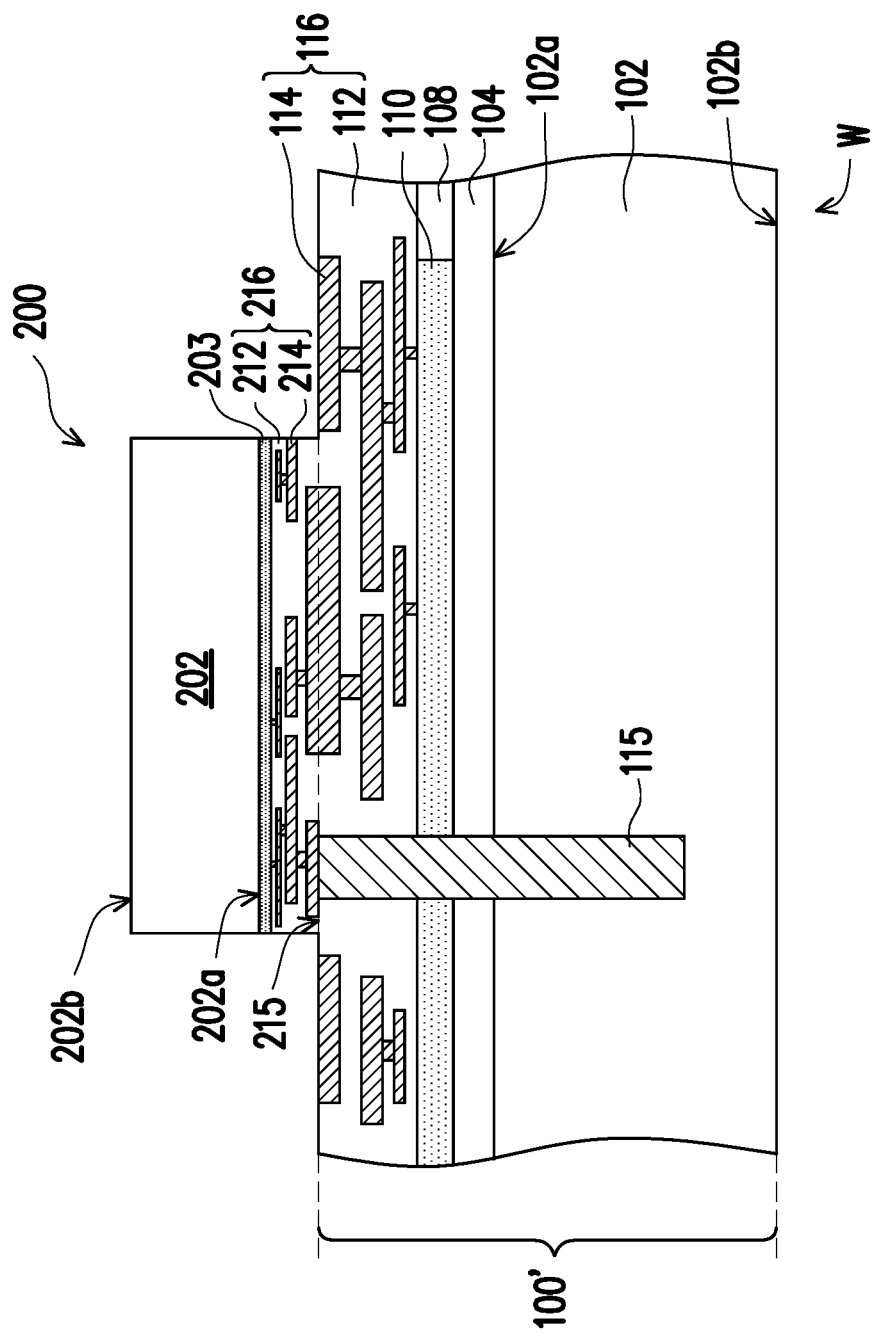

Referring to FIG. 2, an electronic die 200 is provided. In some embodiments, the electronic die 200 includes a substrate 202, a device layer 203, and an interconnect structure 216. The substrate 202 has a first surface 202a and a second surface 202b opposite to each other. The first surface 202a may be referred to as an active surface, and the second surface 202b may be referred to as a non-active surface. The device layer 203 is then formed on the first surface 202a of the substrate 202 in a front-end-of-line (FEOL) process. In some embodiments, the device layer 203 include a wide variety of devices. In some embodiments, the devices comprise active components, passive components, or a combination thereof. In some embodiments, the devices may include integrated circuits devices. The devices are, for example, transistors, capacitors, resistors, diodes, photodiodes, fuse devices, or other similar devices. In some embodiments, the device layer 203 includes a gate structure, source and drain regions, and isolation structures, such as shallow opening isolation (STI) structures (not shown). In the device layer 203, various N-type metal-oxide semiconductor (NMOS) and/or P-type metal-oxide semiconductor (PMOS) devices, such as transistors or memories and the like, may be formed and interconnected to perform one or more functions. Other devices, such as capacitors, resistors, diodes, photodiodes, fuses and the like may also be formed over the substrate 202. The functions of the devices may include memory, processors, sensors, amplifiers, power distribution, input and/or output circuitry, or the like.

As shown in FIG. 2, the interconnect structure 216 is formed on the device layer 203, so that the device layer 203 is disposed between the first surface 202a of the substrate 202 and the interconnect structure 216. In some embodiments, the interconnect structure 216 includes an insulating material 212 and a plurality of metal features 214. The arrangement, material and forming method of the interconnect structure 216 are similar to the arrangement, material and forming method of the interconnect structure 116. Thus, details thereof are omitted here.

As shown in FIG. 2, the electronic die 200 is turned upside down and mounted onto the photonic integrated circuit region 100' of the photonic wafer W. That is, the first surface 202a of the substrate 202 faces toward the first surface 102a of the substrate 102, and the electronic die 200 and the photonic integrated circuit region 100' are face-to-face bonded together via the interconnect structures 116, 216, and the TSV 115, so as to form a die stack structure.

In some embodiments, before the electronic die 200 is bonded to the photonic integrated circuit region 100', the interconnect structure 216 and the interconnect structure 116 are aligned, so that a portion of the topmost metal feature 214 is aligned with the TSV 115 and another portion of the topmost metal feature 214 is aligned with a portion of the topmost metal feature 114. In some embodiments, the alignment of the interconnect structure 216 and the interconnect structure 116 may be achieved by using an optical sensing method. After the alignment is achieved, the interconnect structure 216 and the interconnect structure 116 are bonded together by a hybrid bonding to form a hybrid bonding structure.

The interconnect structure 216 and the interconnect structure 116 are hybrid bonded together by the application of pressure and heat. It is understood that the hybrid bonding involves at least two types of bonding, including metal-to-metal bonding and non-metal-to-non-metal bonding such as dielectric-to-dielectric bonding or fusion bonding. For example, as shown in FIG. 2, a portion of the topmost metal feature 214 is bonded to the TSV 115 by metal-to-metal bonding, another portion of the topmost metal feature 214 is bonded to a portion of the topmost metal feature 114 by metal-to-metal bonding, and a portion of the topmost insulating material 212 is bonded to a portion of the topmost insulating material 112 by non-metal-to-non-metal bonding. However, the embodiments of the present disclosure are not limited thereto. In other embodiments, the interconnect structure 216 and the interconnect structure 116 may be bonded together by other bonding, such as fusion bonding.

It should be noted that a bonding interface 215 is formed between the interconnect structure 216 and the interconnect structure 116 after hybrid bonding. In some embodiments, the bonding interface 215 is a flat surface to make sure the electronic die 200 is well bonded onto the photonic integrated circuit region 100' of the photonic wafer W. In some embodiments, a bondable topography variation (BTV) of the bonding interface 215 may be less than 100 Å per 1 mm range for better bonding. Herein, the bondable topography variation (BTV) is referred as a height difference between a highest point and a lowest point of the bonding interface 215 between the interconnect structure 216 and the interconnect structure 116. In some alternative embodiments, when the topmost metal features 114 and 214, and the TSV 115 have the same metal material, such Cu, some interfaces between the topmost metal features 114 and 214 and between the topmost metal feature 214 and the TSV may not exist because of Cu alloy formed. On the other hands, when the topmost interconnect structures 216 and 116 have different dielectric materials, such as SiO and SiN, an interfacial layer with elements Si, O, and N may exist between the interconnect structure 216 and the interconnect structure 116. In the case, the bonding interface 215 may be discontinuous.

Figure 3:
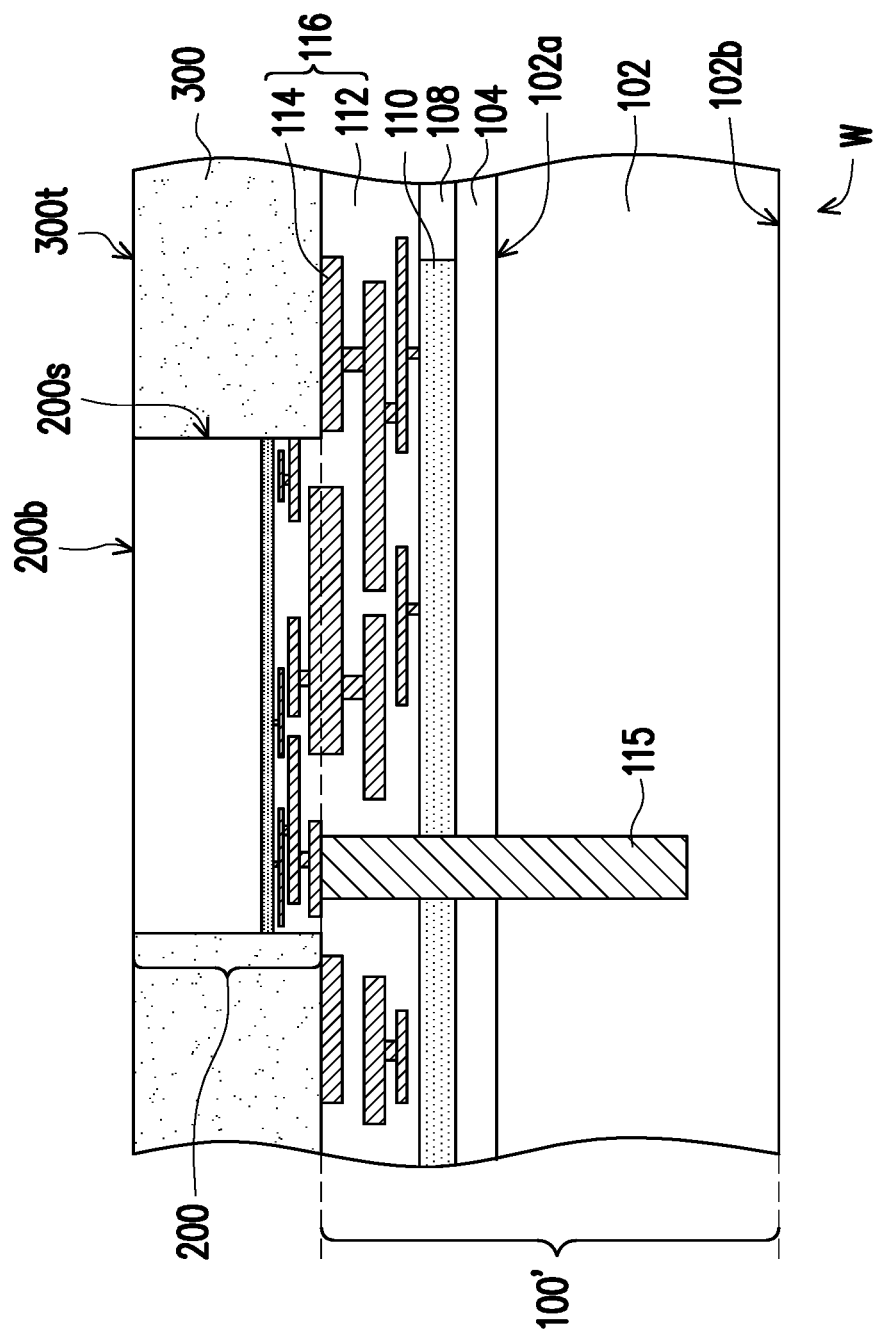

Referring to FIG. 3, an insulating layer 300 is formed to laterally encapsulate the electronic die 200. In some embodiments, the insulating layer 300 is formed by forming an insulating material on the interconnect structure 116 to cover sidewalls 200s and a back side 200b of the electronic die 200. Herein, the insulating material may be referred to as a gap-fill material including an inorganic dielectric material, an organic dielectric material, or a combination thereof. The inorganic dielectric material may include oxide such as silicon oxide, nitride such as silicon nitride, oxynitride such as silicon oxynitride, tetraethoxysilane (TEOS), or the like. The organic dielectric material may include a molding compound, a molding underfill, a resin such as epoxy, or the like. In some embodiments, the insulating material is optically transparent or optically opaque to the optical signal to be processed by the photonic transmission structure 110. Although the insulating layer 300 illustrated in FIG. 3 is a single-layered structure, the disclosure is not limited thereto. In some other embodiments, the insulating layer 300 may be a multi-layered structure and include a plurality of stacked dielectric layers. The stacked dielectric layers may include an inorganic dielectric material, an organic dielectric material, or a combination thereof.

After forming the insulating material, a planarization process is performed on the insulating material to expose the back side 200b of the electronic die 200. In some embodiments, the planarization process includes a chemical mechanical polishing (CMP) process, a mechanical grinding process, or other suitable planarization processes. As shown in FIG. 3, after forming the insulating layer 300, a top surface 300t of the insulating layer 300 is coplanar with the back side 200b of the electronic die 200. In addition, the insulating layer 300 is in physical contact with the sidewalls 200s of the electronic die 200.

Figure 4:
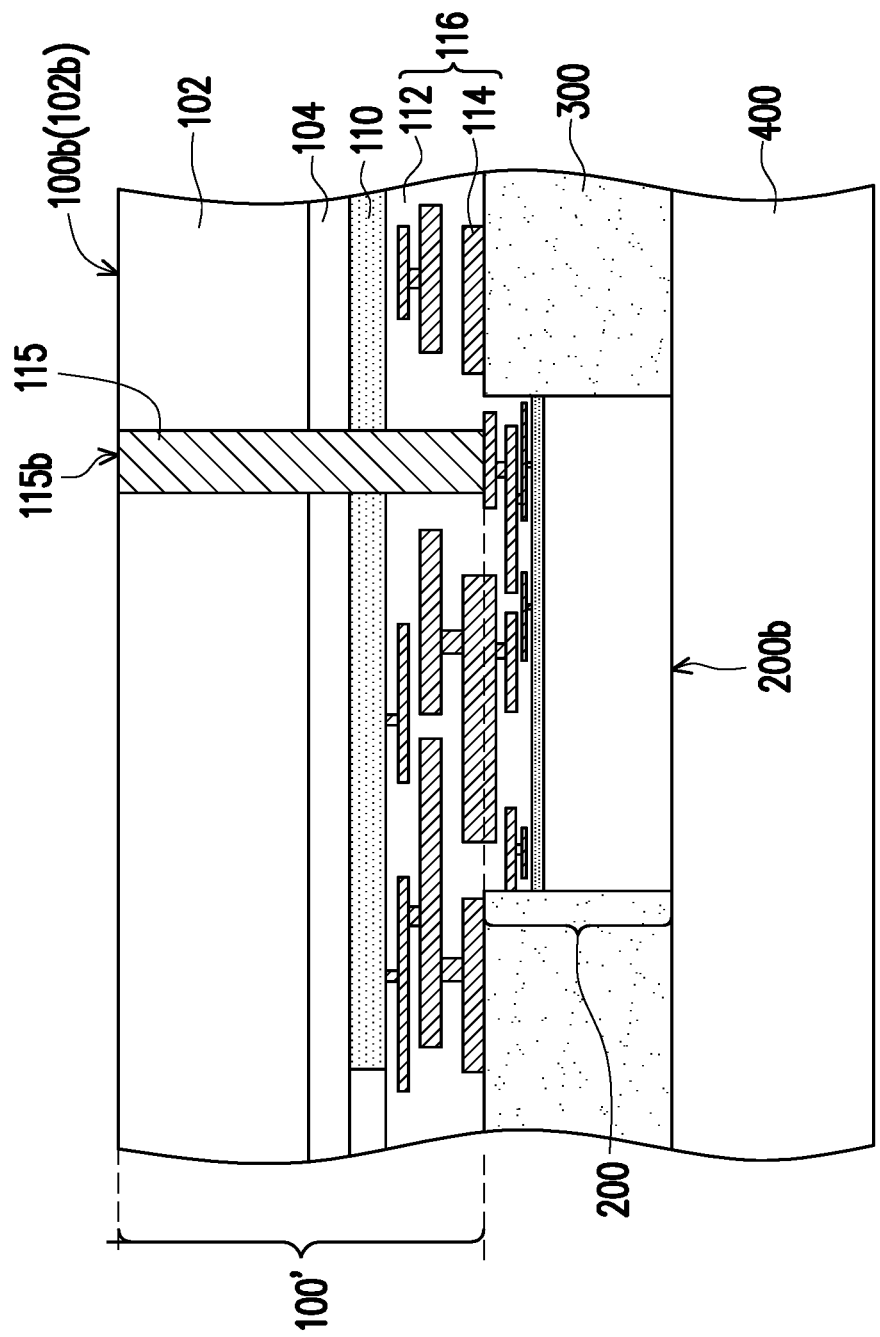

Referring to FIG. 3 and FIG. 4, after forming the insulating layer 300, the structure illustrated in FIG. 3 is turned upside down and mounted onto a support carrier 400 such as a silicon carrier. In some embodiments, an adhesive (not shown) may be formed between the support carrier 400 and the back side 200b of the electronic die 200 and/or between the support carrier 400 and the insulating layer 300. Thereafter, the substrate 102 of the photonic integrated circuit region 100' is grinded to reveal the TSV 115 at a back side 100b of the photonic integrated circuit region 100'. In other words, the height of the second surface 102b of the substrate 102 is reduced until exposing a bottom surface 115b of the TSV 115. In the case, as shown in FIG. 4, the bottom surface 115b of the TSV 115 is coplanar with the back side 100b of the photonic integrated circuit region 100'.

Figure 5:
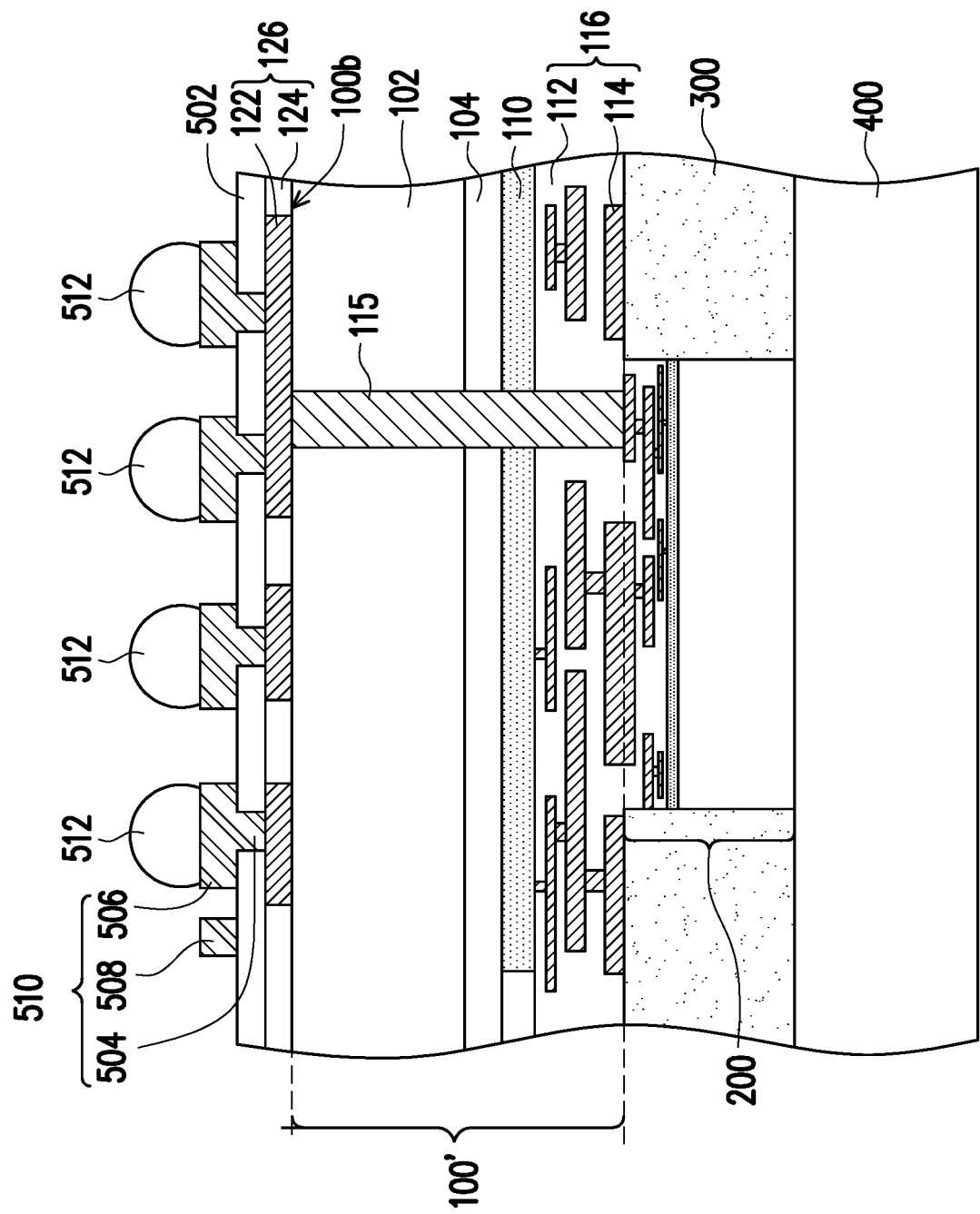

Referring to FIG. 5, an interconnect structure 126 is formed on the back side 100b of the photonic integrated circuit region 100' to (physically) contact with the TSV 115. In some embodiments, the interconnect structure 126 includes an insulating material 122 and a plurality of metal features 124. The arrangement, material and forming method of the interconnect structure 126 are similar to the arrangement, material and forming method of the interconnect structure 116. Thus, details thereof are omitted here.

After forming the interconnect structure 126, a dielectric layer 502 is formed on the interconnect structure 126. In some embodiments, the dielectric layer 502 include an inorganic dielectric material, an organic dielectric material, or a combination thereof, and may be formed by a CVD or the like. The inorganic dielectric material may include silicon oxide, silicon nitride, silicon oxynitride, the like, or a combination thereof. The organic dielectric material may include polybenzoxazole (PBO), polyimide (PI), benzocyclobutene (BCB), the like, or a combination thereof.

A conductive layer 510 is then formed on the dielectric layer 502. A material of the conductive layer 510 is different from the material of the metal features 124. In some embodiments, the material of the conductive layer 510 is softer than the material of the metal features 124. For example, the conductive layer 510 is made of Al, and the metal features 124 is made of Cu. The conductive layer 510 may include a metal material, such as aluminum, copper, nickel, gold, silver, tungsten, or a combination thereof, and may be formed by depositing a metal material layer through a suitable process such as electro-chemical plating process, CVD, atomic layer deposition (ALD), physical vapor deposition (PVD), or the like, and then patterning the metal material layer.

In detail, the conductive layer 510 include a plurality of conductive vias 504, a plurality of conductive pads 506 and a dam structure 508. In some embodiments, the conductive vias 504 penetrate through the dielectric layer 502 to connect with the interconnect structure 126 and the conductive pads 506. The conductive pads 506 and the dam structure 508 are disposed on the dielectric layer 502 and at substantially the same level. Herein, when elements are described as "at substantially the same level", the elements are formed at substantially the same height in the same layer, or having the same positions embedded by the same layer. In some embodiments, the elements at substantially the same level are formed from the same material(s) with the same process step(s). In some embodiments, the tops of the elements at substantially the same level are substantially coplanar. For example, as shown in FIG. 5, the conductive pads 506 and the dam structure 508 have the same height.

Thereafter, a plurality of connectors 512 are formed on the conductive pads 506, while no connector is formed on the dam structure 508. In some embodiments, the connectors 512 are controlled collapse chip connection (C4) bumps, ball-grid array (BGA) balls, or the like. It should be noted that the dam structure 508 may be referred to as a dummy structure which is electrically floating or is not electrically connected to the interconnect structure 126 and the connectors 512.

Figure 6:
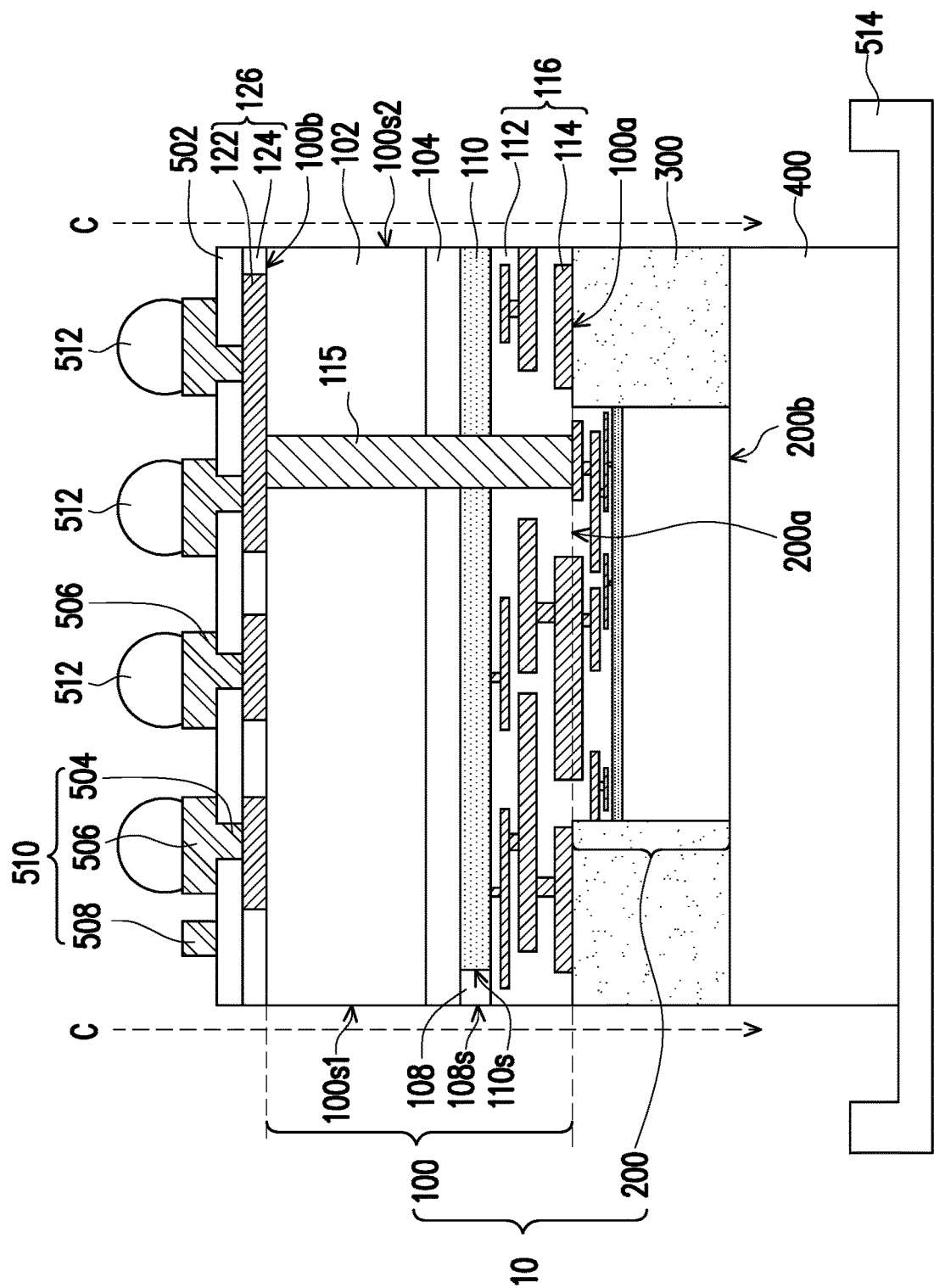
Figure 7A:
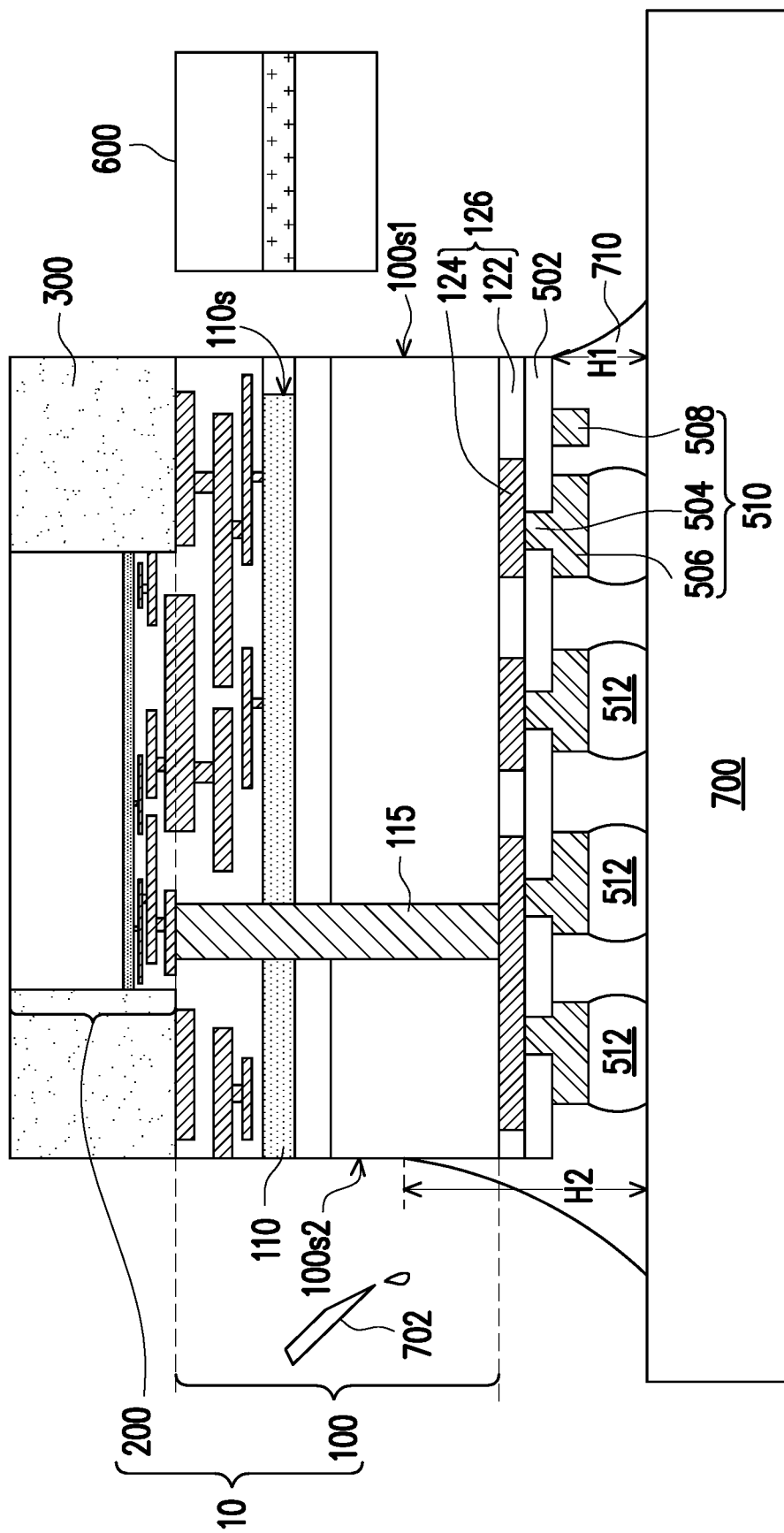
FIG. 7A is a schematic cross-sectional view of a package structure in accordance with a first embodiment of the present disclosure.
Figures 7B, 7C:
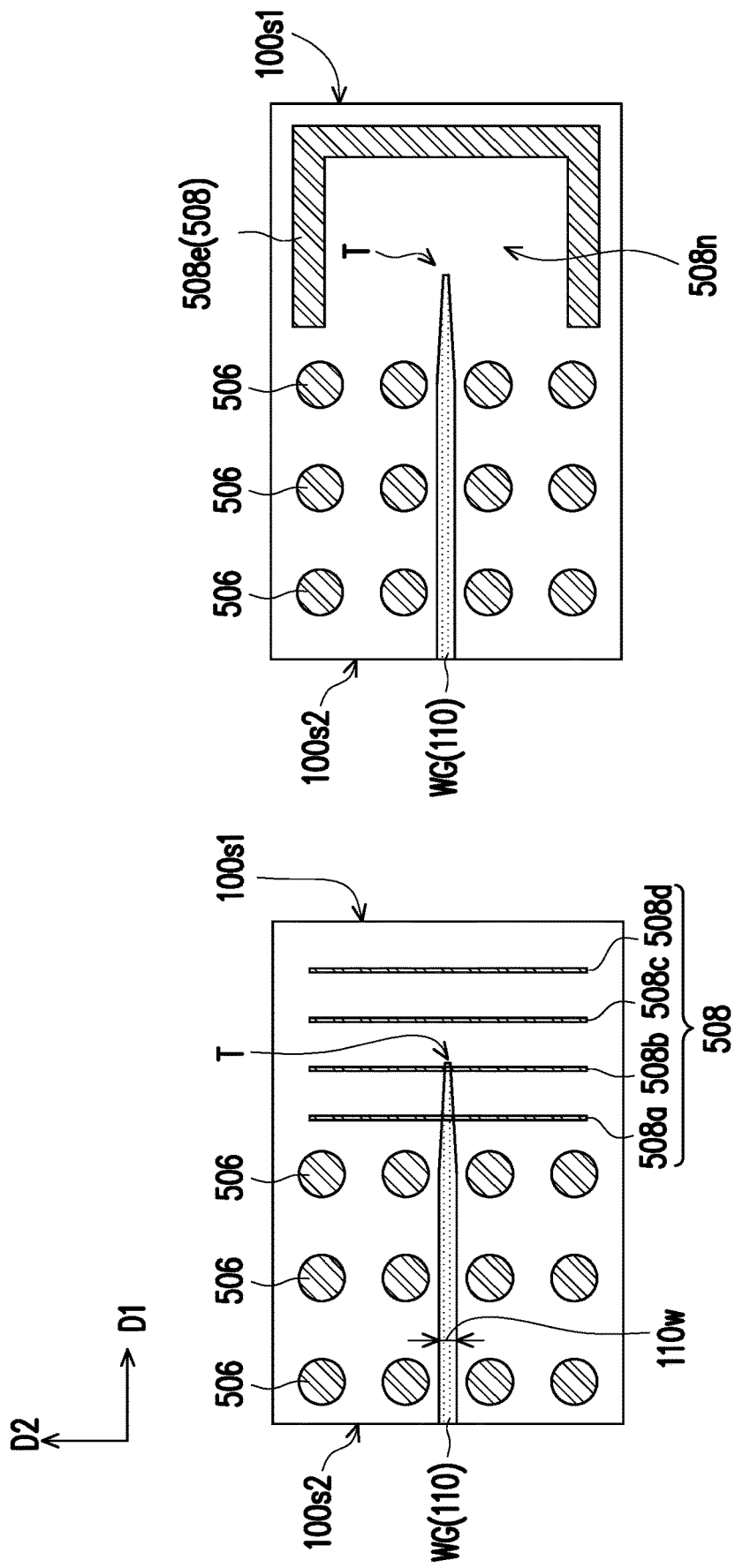
FIG. 7B is a schematic top view of the package structure illustrated in FIG. 7A.
FIG. 7C is another schematic top view of the package structure illustrated in FIG. 7A.

Referring to FIG. 6, the structure illustrated in FIG. 5 is mounted onto a film frame 514. Thereafter, a singulation process is performed along the lines C, so that a plurality of singulated die stack structures 10 are formed. As shown in FIG. 6, the die stack structure 10 includes a photonic die 100, the electronic die 200, the insulating layer 300, the conductive layer 512, and the connectors 512. The photonic die 100 has a front side 100a and a back side 100b opposite to each other. In addition, the photonic die 100 has a first sidewall 100s1 and a second sidewall 100s2 opposite to each other. The photonic die 100 further includes the photonic transmission structure 110 extending from the second sidewall 100s2 to the first sidewall 100s1, and a sidewall 110s of the photonic transmission structure 110 is concave from the first sidewall 100s1. The protection layer 108 covers the sidewall 110s of the photonic transmission structure 110 to protect the photonic transmission structure 110 from the optical transmission noise. In some embodiments, the protection layer 108 is optically transparent to the optical signal to be processed by the photonic transmission structure 110. The protection layer 108 has a sidewall 108s aligned with the first sidewall 100s1. The front side 100a of the photonic die 100 faces toward a front side 200a of the electronic die 200, and the photonic die 100 and the electronic die 200 are bonded together by the hybrid bonding. The insulating layer 300 laterally encapsulate the electronic die 200. The conductive layer 510 is disposed on a back side 100b of the photonic die 100. In some embodiments, the conductive layer 510 has the conductive pads 506 and the dam structure 508. The conductive pads 506 is electrically connected to the photonic die 100 and electronic die 200 by the conductive vias 504, the interconnect structure 126, and the TSV 115. The dam structure 508 is disposed between the conductive pads 506 and the first sidewall 100s1. That is, as shown in FIG. 6, the dam structure 508 is closer to the first sidewall 100s1 than the conductive pads 506. The connectors 512 are disposed on the conductive pads 506 of the conductive layer 510 and not on the dam structure 508.

Referring to FIG. 6 and FIG. 7A, the die stack structure 10 is de-mounted from the support carrier 400, and is further turned upside down so that the connectors 512 toward a circuit substrate 700. The die stack structure 10 is then bonded onto the circuit substrate 700 by the connectors 512. In some embodiments, the circuit substrate 700 is made of a semiconductor material, such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the circuit substrate 700 may be a SOI substrate. Generally, an SOI substrate includes a layer of a semiconductor material such as epitaxial silicon, germanium, silicon germanium, SOI, SGOI, or combinations thereof. The circuit substrate 700 is, in one alternative embodiment, based on an insulating core such as a fiberglass reinforced resin core. One example core material is fiberglass resin such as FR4. Alternatives for the core material include bismaleimide-triazine BT resin, or alternatively, other PCB materials or films. Build up films such as ABF or other laminates may be used for circuit substrate 700.

The circuit substrate 700 may include active and passive devices (not shown), such as transistors, capacitors, resistors, combinations of these, and the like may be used to generate the structural and functional requirements of the design. The circuit substrate 700 may also include metallization layers and vias and bond pads over the metallization layers and vias. The metallization layers may be formed over the active and passive devices and are designed to connect the various devices to form functional circuitry. The metallization layers may be formed of alternating layers of dielectric (e.g., low-k dielectric material) and conductive material (e.g., copper) with vias interconnecting the layers of conductive material and may be formed through any suitable process (such as deposition, damascene, dual damascene, or the like). In some other embodiments, the circuit substrate 700 is substantially free of active and passive devices.

As shown in FIG. 7A, after bonding the die stack structure 10 onto the circuit substrate 700, an underfill 710 is dispensed to laterally encapsulate the connectors 512, the conductive pads 506, and the dam structure 508 by using a dispenser 702. In the case, the dam structure 508 is electrically isolated from the conductive pads 506 by the underfill 710. In some embodiments, the underfill 710 is injected at the second sidewall 100s2 of the photonic die 100. The underfill 710 then flows into a gap between the die stack structure 10 and the circuit substrate 700, and extends from the second sidewall 100s2 to the first sidewall 100s1 through the capillary force. In some embodiments, the underfill 710 includes a base material and filler particles in base material. The base material may be a polymer, a resin, an epoxy, or the like. The filler particles may be dielectric particles of $SiO_2$, $Al_2O_3$, silica, or the like, and may have spherical shapes. Also, the spherical filler particles may have a plurality of different diameters. After forming the underfill 710, a package structure 1 including the electronic die 200 bonding to the photonic die 100 is accomplished. An optical fiber 600 may be assembled to align with the photonic transmission structure 110. In the manner, the photonic transmission structure 110 may communicate with external components through one or more optical fibers 600.

In should be noted that the dam structure 508 can stop the underfill 710 over-flowing and prevent the underfill 710 from climbing onto the first sidewall 100s1 of the photonic die 100. In the case, as shown in FIG. 7A, the underfill 710 may cover a portion of the second sidewall 100s2 of the photonic die 100 while not cover the first sidewall 100s1 of the photonic die 100. Since the underfill 710 does not cover the first sidewall 100s1 of the photonic die 100, especially the sidewall 110s of a photonic transmission structure 110. no underfill is included in an optical path that the optical fiber 600 is optically coupled to the photonic transmission structure 110, thereby improving the optical transmission noise between the photonic transmission structure 110 and the optical fiber 600. In some embodiments, the underfill 710 at the first sidewall 100s1 of the photonic die 100 has a first height H1, the underfill 710 at the second sidewall 100s2 of the photonic die 100 has a second height H2, and the first height H1 is lower than the second height H2. In some embodiments, the first height H1 may be in a range of about 30 μm to about 50 μm, the second height H2 may be in a range of about 400 μm to about 500 μm, and a ratio (H2/H1) of the second height H2 to the first height H1 is in a range of 17 to 8. In some alternative embodiments, the underfill 710 may cover a portion of the first sidewall 100s1 of the photonic die 100, and a topmost point of the underfill 710 covering the first sidewall 110s is lower than a bottom surface of the photonic transmission structure 110.

FIG. 7B illustrates a vertical projection of the photonic transmission structure 110 on an extending plane of the conductive layer 510 according to one embodiment. Referring to FIG. 7B, the photonic transmission structure 110 includes a waveguide WG extending along a first direction D1. In some embodiments, the waveguide WG has a tapered end and has a width 110w gradually decreasing from the second sidewalls 100s2 to the first sidewall 100s1. Optical signals are coupled from the tapered end of the waveguide WG into the optical fiber 600 at the first sidewall 100s1 (FIG. 7A). In some alternative embodiments, the end of the waveguide WG may have a shape that is different than a tapered shape, such as a rounded shape or a flat shape.

As shown in FIG. 7B, the dam structure 508 includes a plurality of strip structures 508a, 508b, 508c, and 508d arranged alternately along the first direction D1 and extending along a second direction D2 perpendicular to the first direction D1. The conductive pads 506 are arranged in an array. A vertical projection of the waveguide WG extends from the second sidewall 100s2 through the space between by the conductive pads 506 and then into the dam structure 508. In some embodiments, the vertical projection of the waveguide WG at least partially overlaps with a vertical projection of the dam structure 508. The vertical projection of the waveguide WG may have a tip T at least penetrating one of vertical projections of the strip structures 508a, 508b, 508c, and 508d. For example, as shown in 7B, the tip T of the vertical projection of the waveguide WG penetrates the vertical projections of two strip structures 508a and 508b.

FIG. 7C illustrates a vertical projection of the photonic transmission structure 110 on an extending plane of the conductive layer 510 according to another embodiment. Referring to FIG. 7C, the photonic transmission structure 110 includes a waveguide WG extending along the first direction D1. In some embodiments, the waveguide WG has the tapered end. The dam structure 508 includes a C-shaped structure 508e, and a notch 508n of the C-shaped structure 508e faces the conductive pads 506 arranged in the array. In some embodiments, the vertical projection of the waveguide WG has the tip T surrounded by the vertical projection of the C-shaped structure 508e. That is, the tip T of the vertical projection of the waveguide WG extends from the second sidewall 100s2 through the space between the conductive pads 506 and then into the notch 508n of the C-shaped structure 508e.

Although the photonic transmission structure 110 illustrated in FIG. 7B or FIG. 7C is the continuous waveguide WG extending from the second sidewall 100s2 to the first sidewall 100s1, the disclosure is not limited thereto. A process flow of forming the photonic transmission structure is described below in FIG. 8A to FIG. 8C, in accordance with some embodiments.

Figure 8A:
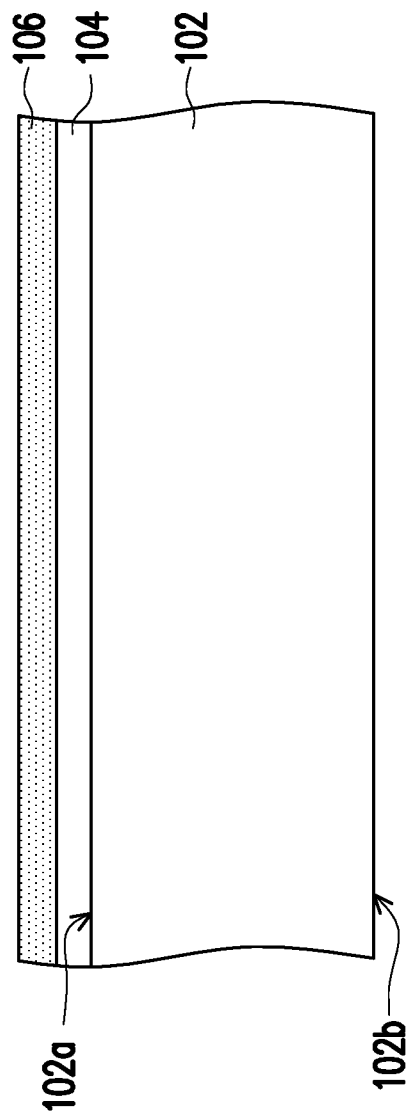
FIG. 8A to FIG. 8C are schematic cross-sectional views of intermediate steps during a process for forming a photonic transmission structure in accordance with some embodiments of the present disclosure.
Figure 8B:
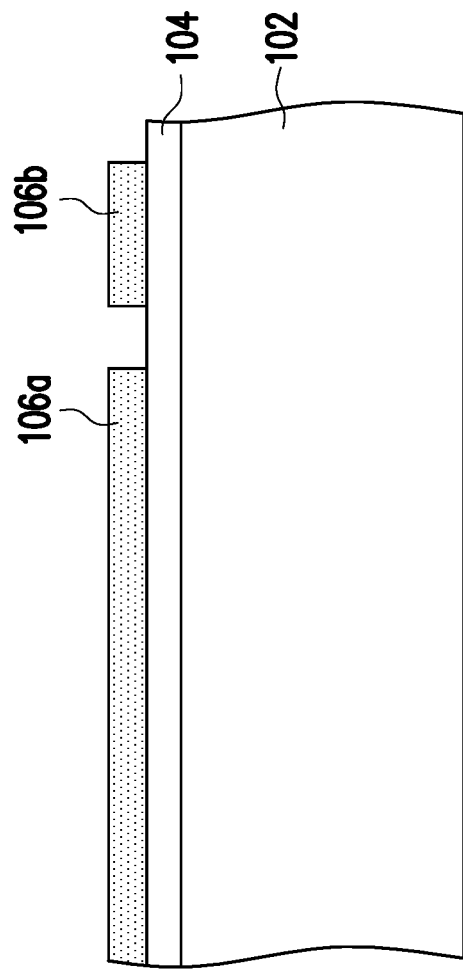
Figure 8C:
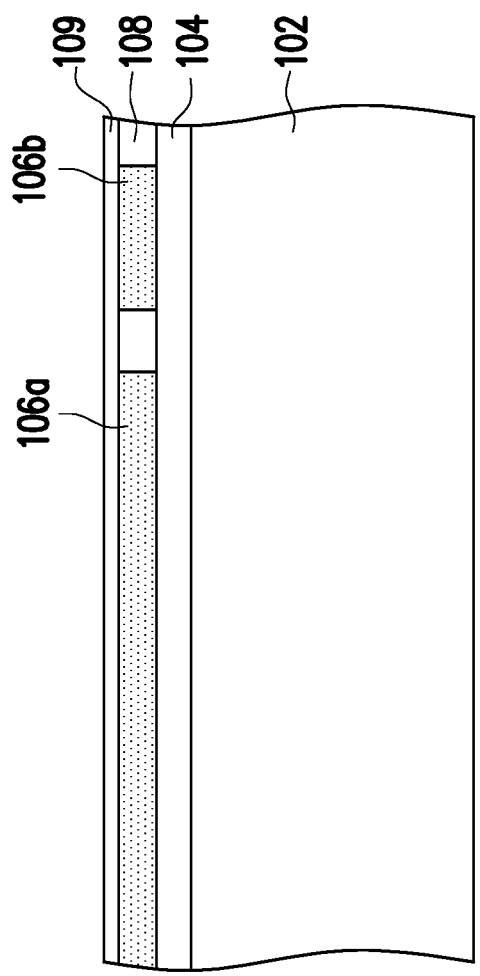
Figure 9:
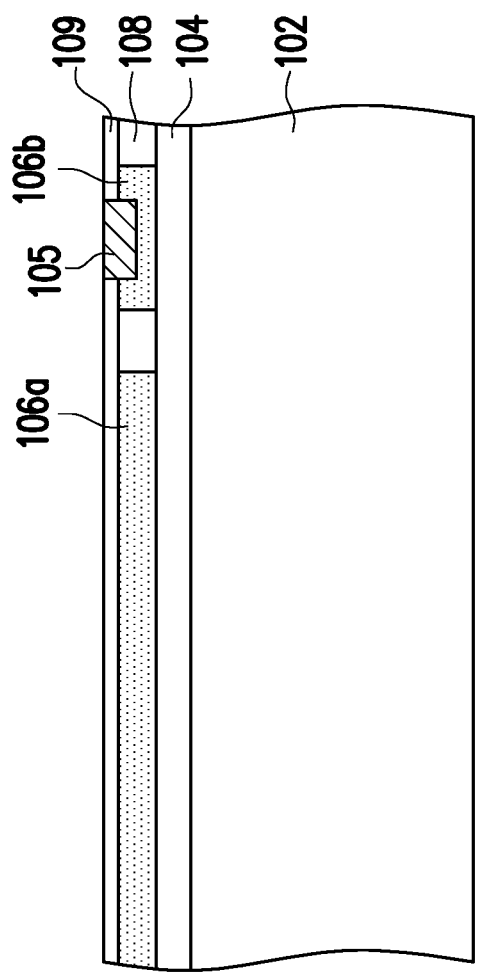
FIG. 9 is a schematic cross-sectional view of another photonic transmission structure in accordance with some embodiments of the present disclosure.

FIG. 8A to FIG. 8C are schematic cross-sectional views of intermediate steps during a process for forming a photonic transmission structure in accordance with some embodiments of the present disclosure. FIG. 9 is a schematic cross-sectional view of another photonic transmission structure in accordance with some embodiments of the present disclosure.

Referring to FIG. 8A, after forming the dielectric layer 104 on the substrate 102, a silicon layer 106 is formed on the dielectric layer 104. In some embodiments, the silicon layer 106 includes doped silicon or undoped silicon. The silicon layer 106 may have a thickness between about 1 μm and about 10 μm, and is formed by a CVD, an epitaxial growth process, or other suitable deposition processes. In some alternative embodiments, the silicon layer 106 may be single crystal silicon, polysilicon, or amorphous silicon. In some embodiments, the substrate 102, the dielectric layer 104, and silicon layer 106 may be referred to as a buried oxide (BOX) substrate.

Referring to FIG. 8B, the silicon layer 106 is patterned to form a first portion 106a and a second portion 106b separated from each other. In some embodiments, the patterned silicon layer 106a and 106b may be referred to as the photonic transmission structure 110 illustrated in FIG. 7A. In detail, the silicon layer 106 is patterned by forming a mask layer on the silicon layer 106, performing one or more etching steps, such as dry etching and/or wet etching, to transfer a pattern of the mask layer onto the silicon layer 106. For illustrative purposes, the first portion 106a and the second portion 106b are shown as disconnected, but the disclosure is not limited thereto. In other embodiments, the first portion 106a and the second portion 106b may be connected to each other. In some embodiments, the first and second portion 106a and 106b may have different optical components, such as waveguides, modulators, grating coupler, edge coupler, filters or a combination thereof. For example, when the first portion 106a is the waveguide and the second portion 106b is the edge coupler, the edge coupler 106b is closer to a sidewall of the substrate 102 than the waveguide 106a, so that edge coupler 106b is ease to be optically coupled with the optical fiber 600 (FIG. 7A).

Referring to FIG. 8C, the protection layer 108 is formed on the dielectric layer 104 and laterally encapsulating the first portion 106a and the second portion 106b. In detail, the protection layer 108 is formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulating materials formed by any acceptable process may be used. In some embodiments, a planarization process (e.g., a chemical-mechanical polishing process) is performed so that the protection layer 108 and the first and second portion 106a and 106b are coplanar. Accordingly, the protection layer 108 may have about the same thickness as the first and second portion 106a and 106b, which may be between about 0.5 µm and about 5 µm. In some embodiments, after planarizing the protection layer 108, an implantation process may be performed to introduce dopants within the first and second portion 106a and 106b, as part of the formation of the photodetector and modulator. The first and second portion 106a and 106b may be doped with p-type dopants, n-type dopants, or a combination.

As shown in FIG. 8C, after forming the protection layer 108, an etch stop layer (ESL) 109 may be optionally formed on the first and second portion 106a and 106b for the subsequent interconnect structure. The ESL 109 may be a dielectric material such as silicon carbide (SiC), silicon carbonitride (SiCN), silicon oxycarbonitride (SiOCN), or the like, and may be formed by a CVD, an ALD, the like, or a combination thereof.

In some alternative embodiments, as shown in FIG. 9, a semiconductor layer 105 is optionally formed on the second portion 106b to form a photodetector. The semiconductor layer 105 may be formed by patterning the ESL 109 to form an opening, and epitaxially growing a semiconductor material on the portion of the second portion 106b exposed by the opening. In some embodiments, the semiconductor material may be germanium (Ge), which may be doped or un-doped.

Figure 10A:
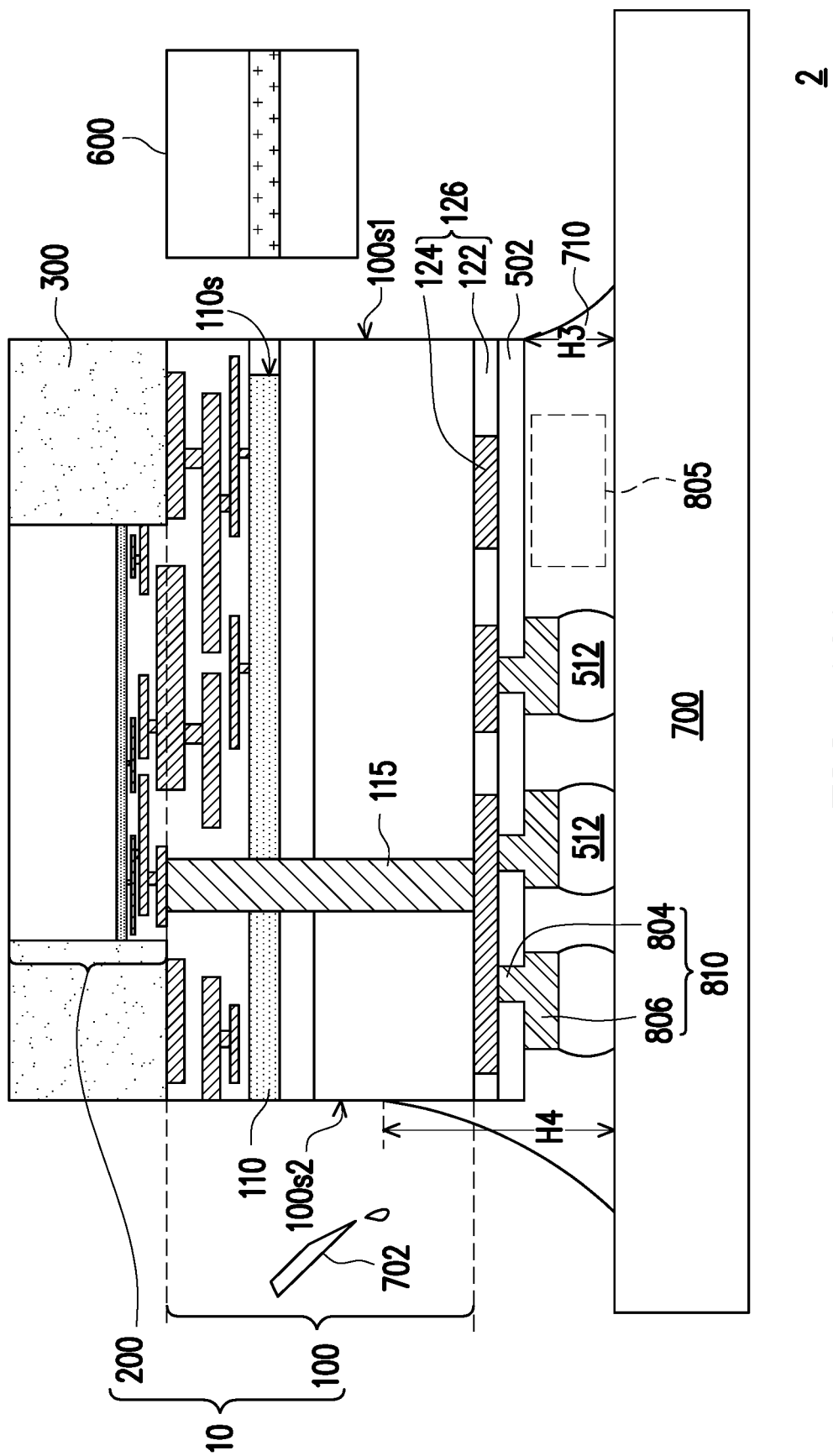
FIG. 10A is a schematic cross-sectional view of a package structure in accordance with a second embodiment of the present disclosure.
Figure 10B:
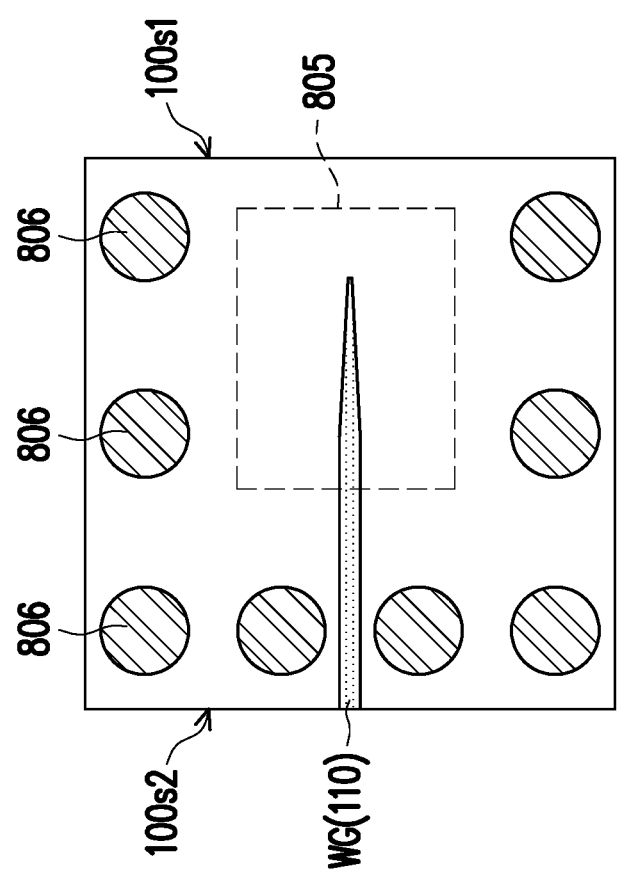
FIG. 10B is a schematic top view of the package structure illustrated in FIG. 10A.

FIG. 10A is a schematic cross-sectional view of a package structure in accordance with a second embodiment of the present disclosure. FIG. 10B is a schematic top view of the package structure illustrated in FIG. 10A.

Referring to FIG. 10A, the configuration and the forming method of a package structure 2 are similar to the configuration and the forming method of the package structure 1, and thus details thereof are omitted herein. A main difference between the package structures 1 and 2 lies in that a conductive layer 810 of the package structure 2 include a plurality of conductive via 804 and a plurality of conductive pads 806 while not include any dam structure. The conductive vias 804 penetrate through the dielectric layer 502 to connect with the interconnect structure 126 and the conductive pads 806. In some embodiments, the number of the conductive pads 806 and the connectors 512 thereon in the package structure 2 is less than the number of the conductive pads 506 and the connectors 512 thereon in the package structure 1. In other words, a vacancy 805 is formed between the conductive pads 506 and the first sidewall 100s1 of the photonic die 100. In the case, when the underfill 710 is dispensed at the second sidewall 100s2 of the photonic die 100 by using the dispenser 702, the excessive underfill 710 can stay in the vacancy 805 without climbing on the first sidewall 100s1 of the photonic die 100. As such, no underfill is included in an optical path that the optical fiber 600 is optically coupled to the photonic transmission structure 110, thereby improving the optical transmission noise between the photonic transmission structure 110 and the optical fiber 600. In some embodiments, the underfill 710 at the first sidewall 100s1 of the photonic die 100 has a third height H3, the underfill 710 at the second sidewall 100s2 of the photonic die 100 has a fourth height H4, and the third height H3 is lower than the fourth height H4. In some embodiments, the third height H3 may be in a range of about 30 µm to about 50 µm, the fourth height H4 may be in a range of about 400 µm to about 500 µm, and a ratio (H4/H3) of the fourth height H4 to the third height H3 is in a range of 17 to 8. In some alternative embodiments, the underfill 710 may cover a portion of the first sidewall 100s1 of the photonic die 100, and a topmost point of the underfill 710 covering the first sidewall 110s is lower than a bottom surface of the photonic transmission structure 110.

FIG. 10B illustrates a vertical projection of the photonic transmission structure 110 on an extending plane of the conductive layer 810 according to an embodiment. As shown in FIG. 10B, the conductive pads 806 are arranged in a C-shape, and a notch of the C-shape faces the first sidewall 100s1 of the photonic die 100. In some embodiments, the photonic transmission structure 110 includes a waveguide WG extending along a direction from the second sidewall 100s2 toward the first sidewall 100s1. The vertical projection of the waveguide WG has a tip T within a recess of a vertical projection of the C-shape.

Figure 11A:
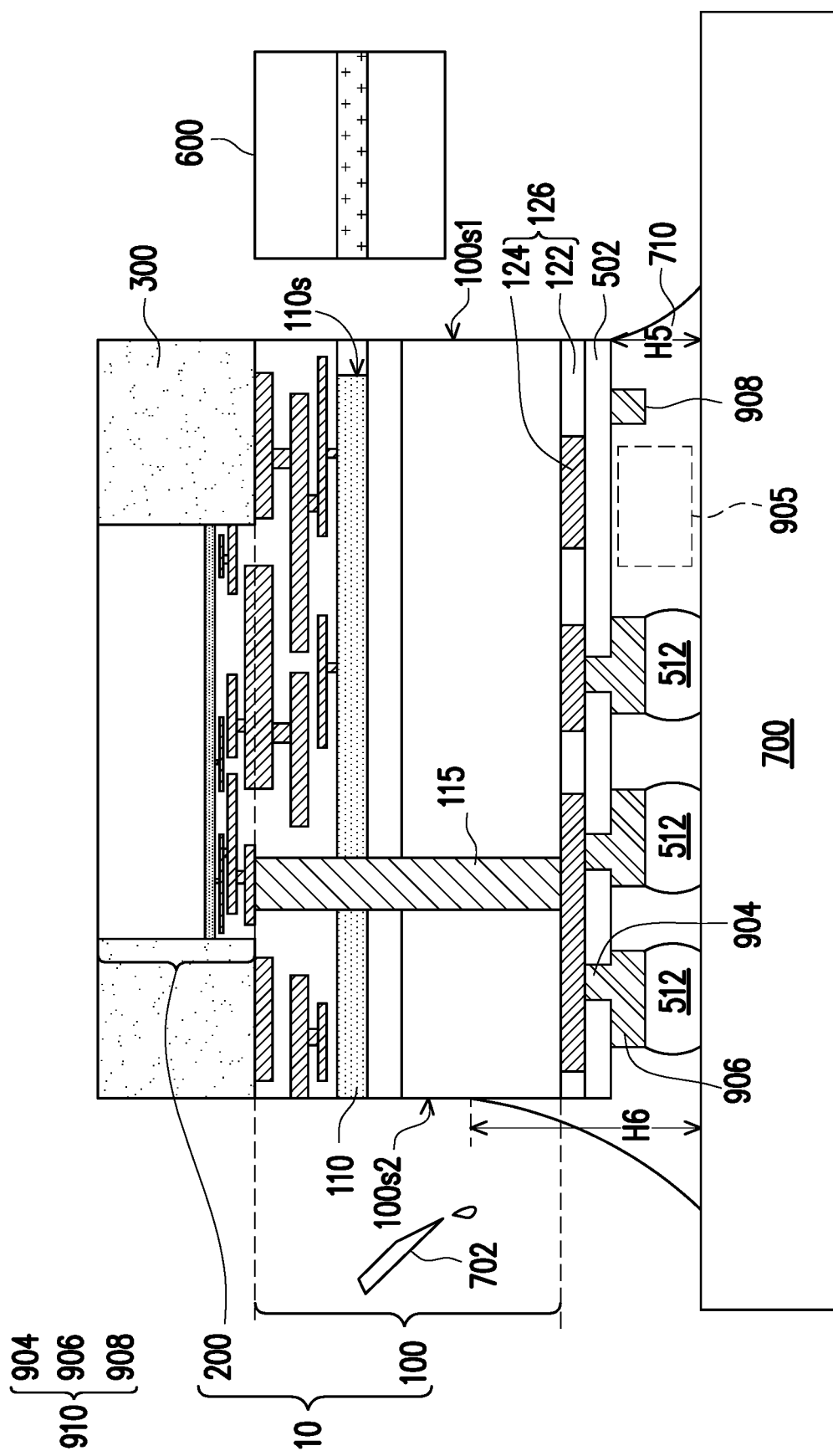
FIG. 11A is a schematic cross-sectional view of a package structure in accordance with a third embodiment of the present disclosure.
Figure 11B:
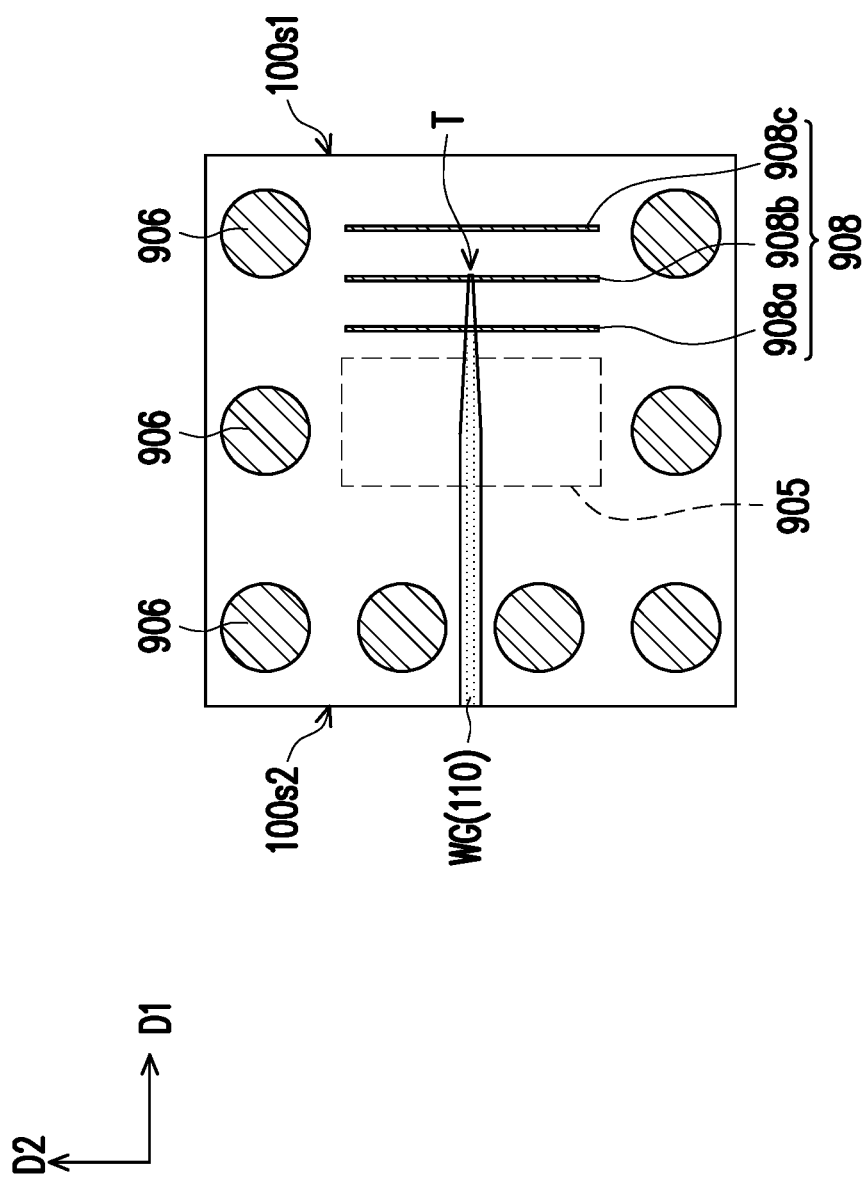
FIG. 11B is a schematic top view of the package structure illustrated in FIG. 11A.

FIG. 11A is a schematic cross-sectional view of a package structure in accordance with a third embodiment of the present disclosure. FIG. 11B is a schematic top view of the package structure illustrated in FIG. 11A.

Referring to FIG. 11A, the configuration and the forming method of a package structure 3 are similar to the configuration and the forming method of the package structure 1, and thus details thereof are omitted herein. A main difference between the package structures 1 and 3 lies in that the number of the conductive pads 906 and the connectors 512 thereon in the package structure 3 is less than the number of the conductive pads 506 and the connectors 512 thereon in the package structure 1. As shown in FIG. 11A, a conductive layer 910 of the package structure 3 include a plurality of conductive via 904 and a plurality of conductive pads 906, and a dam structure 908. The conductive vias 904 penetrate through the dielectric layer 502 to connect with the interconnect structure 126 and the conductive pads 906. The conductive pads 906 and the dam structure 908 are disposed on the dielectric layer 502 and at substantially the same level.

It should be noted that a vacancy 905 is formed between the conductive pads 906 and the dam structure 908. In the case, when the underfill 710 is dispensed at the second sidewall 100s2 of the photonic die 100 by using the dispenser 702, the excessive underfill 710 can stay in the vacancy 905 without across dam structure 908. In addition, the dam structure 908 can stops the underfill 710 overflowing and further prevents the underfill 710 from climbing onto the first sidewall 100s1 of the photonic die 100. As such, no underfill is included in an optical path that the optical fiber 600 is optically coupled to the photonic transmission structure 110, thereby improving the optical transmission noise between the photonic transmission structure 110 and the optical fiber 600. In some embodiments, the underfill 710 at the first sidewall 100s1 of the photonic die 100 has a fifth height H5, the underfill 710 at the second sidewall 100s2 of the photonic die 100 has a sixth height H6, and the fifth height H5 is lower than the sixth height H6. In some embodiments, the fifth height H5 may be in a range of about 30 µm to about 50 µm, the sixth height H6 may be in a range of about 400 µm to about 500 µm, and a ratio (H6/H5) of the sixth height H6 to the fifth height H5 is in a range of 17 to 8. In some alternative embodiments, the underfill 710 may cover a portion of the first sidewall 100s1 of the photonic die 100, and a topmost point of the underfill 710 covering the first sidewall 110s is lower than a bottom surface of the photonic transmission structure 110.

FIG. 11B illustrates a vertical projection of the photonic transmission structure 110 on an extending plane of the conductive layer 910 according to an embodiment. As shown in FIG. 11B, the conductive pads 906 are arranged in a C-shape, and a notch of the C-shape faces the first sidewall 100s1 of the photonic die 100. The dam structure 908 is located within a recess of the C-shape, the dam structure 908 includes a plurality of strip structures 908a, 908b, and 908c arranged alternately along the first direction D1 and extending along the second direction D2. The photonic transmission structure 110 may include a waveguide WG extending along the first direction D1. In some embodiments, the vertical projection of the waveguide WG at least partially overlaps with the vertical projection of the dam structure 908. The vertical projection of the waveguide WG may have the tip T at least penetrating one of vertical projections of the strip structures 908a, 908b, and 908c. For example, as shown in 11B, the tip T of the vertical projection of the waveguide WG penetrates the vertical projections of two strip structures 908a and 908b. In some alternative embodiments, the dam structure 908 may include a C-shaped structure with a notch facing the second sidewall 100s2, as shown in FIG. 7C. The C-shaped structure is within the recess of the C-shape arranged by the conductive pads 906. In some other embodiments, the dam structure 908 may be disposed out of the recess of the C-shape arranged by the conductive pads 906, so that the vacancy 905 would expand to the entire recess of the C-shape arranged by the conductive pads 906.

Figure 12:
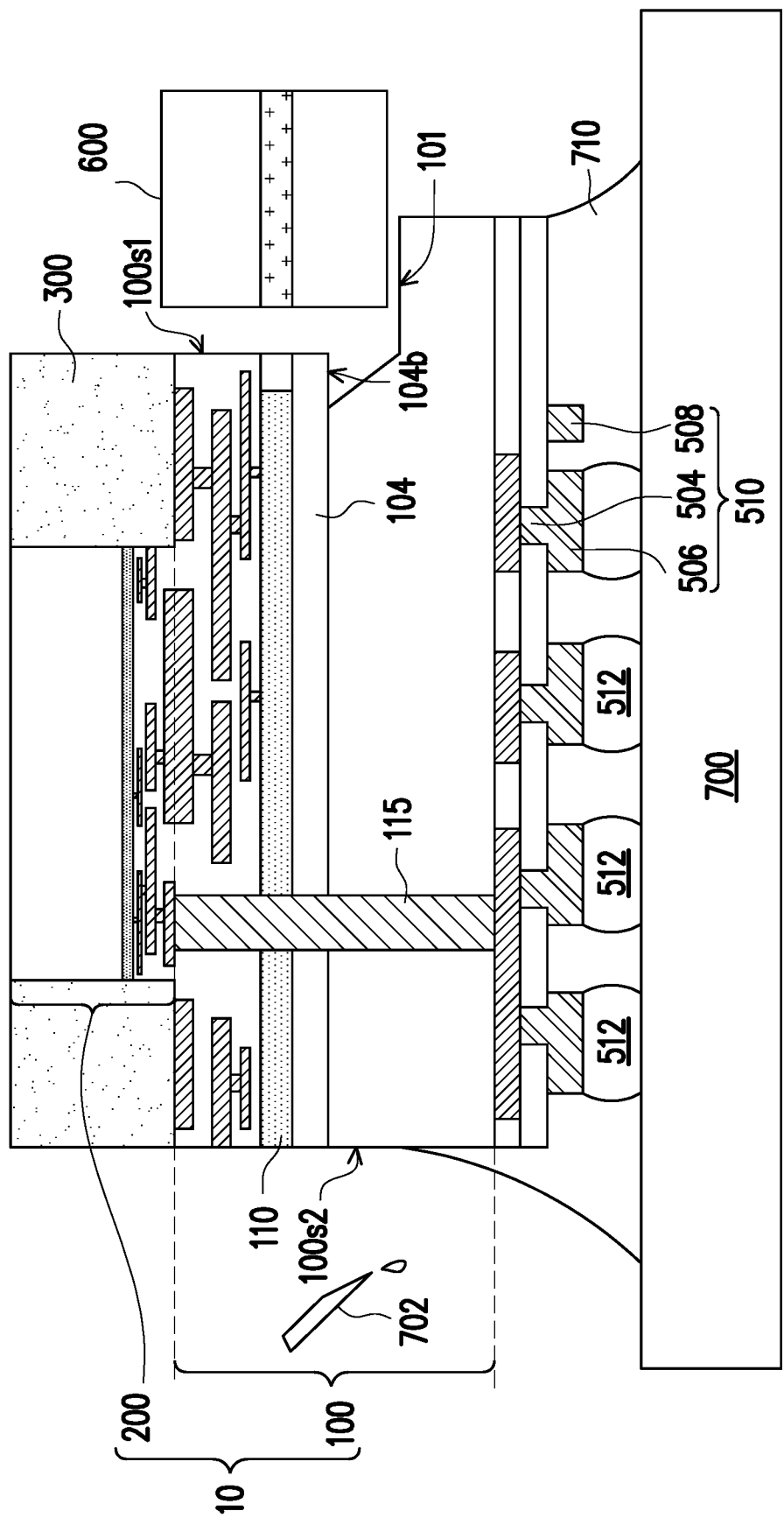
FIG. 12 is a schematic cross-sectional view of a package structure in accordance with a fourth embodiment of the present disclosure.

FIG. 12 is a schematic cross-sectional view of a package structure in accordance with a fourth embodiment of the present disclosure.

Referring to FIG. 12, the configuration and the method of a package structure 4 is similar to the configuration and the method of the package structure 1, and thus details thereof are omitted herein. A main difference between the package structures 1 and 4 lies in that the package structure 4 has a fiber trench 101 formed in the substrate 102. In detail, the fiber trench 101 may be formed by etching the substrate 102 to expose a bottom surface 104b of the dielectric layer 104. The fiber trench 101 is used to support the optical fiber and facilitate alignment of the optical fiber 600 with the photonic transmission structure 110.

According to some embodiments, a package structure includes a bottom die, a top die, an insulating layer, a circuit substrate, a dam structure, and an underfill. The bottom die has a front side and a back side opposite to each other. The top die is bonded on the front side of the bottom die. The insulating layer is disposed on the front side of the bottom die to laterally encapsulate a sidewall of the top die. The circuit substrate is bonded on the back side of the bottom die through a plurality of connectors. The dam structure is disposed between the circuit substrate and the back side of the bottom die, and connected to the back side of the bottom die. The underfill laterally encapsulates the plurality of connectors and the dam structure. The dam structure is electrically isolated from the circuit substrate by the underfill.

According to some embodiments, a method is provided to include: face-to-face bonding a top die with a bottom die; forming a conductive layer on the back side of the bottom die, wherein the conductive layer comprises a plurality of conductive pads and a dam structure formed between the plurality of conductive pads and a first sidewall of the bottom die; bonding a circuit substrate on the back side of the bottom die through a plurality of connectors and the plurality of conductive pads connecting to each other; and dispensing an underfill at a second sidewall of the bottom die that is opposite to the first sidewall to laterally encapsulate the plurality of connectors, the plurality of conductive pads, and the dam structure, wherein the dam structure is electrically isolated from the circuit substrate by the underfill.

According to some embodiments, a package structure includes a bottom die, a top die, an insulating layer, a plurality of conductive pads, a circuit substrate, and an underfill. The bottom die has a front side and a back side opposite to each other. The top die is bonded on the front side of the bottom die. The insulating layer is disposed on the front side of the bottom die to laterally encapsulate a sidewall of the top die. The plurality of conductive pads are disposed on the back side of the bottom die. The plurality of conductive pads are arranged in a C-shape to form a vacancy between the plurality of conductive pads and a first sidewall of the bottom die. The vacancy is surrounded by the plurality of conductive pads and a notch of the C-shape faces the first sidewall of the bottom die. The circuit substrate is bonded on the back side of the bottom die through a plurality of connectors and the plurality of conductive pads connecting to each other. The underfill laterally encapsulates the plurality of connectors and the plurality of conductive pads. The underfill fills in the vacancy so that no conductive element is formed in the vacancy.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A package structure, comprising:
 a bottom die, having a front side and a back side opposite to each other;
 a top die, bonding on the front side of the bottom die;
 an insulating layer, disposed on the front side of the bottom die to laterally encapsulate a sidewall of the top die;
 a circuit substrate, bonding on the back side of the bottom die through a plurality of connectors;
 a dam structure, disposed between the circuit substrate and the back side of the bottom die, and connected to the back side of the bottom die; and an underfill, laterally encapsulating the plurality of connectors and the dam structure, wherein the dam structure is electrically isolated from the circuit substrate by the underfill.

2. The package structure of claim 1, wherein a sidewall of the insulating layer is aligned with a sidewall of the bottom die.

3. The package structure of claim 1, wherein an interconnect structure of the top die is in direct contact with an interconnect structure of the bottom die, so that the top die and the bottom die are face-to-face bonded together.

4. The package structure of claim 1, wherein the bottom die comprises:
    a substrate, having a first surface and a second surface opposite to each other;
    a photonic transmission structure, disposed on the first surface of the substrate;
    an interconnect structure, disposed on the photonic transmission structure; and
    a through substrate via (TSV), embedded in the substrate, and penetrating through the photonic transmission structure and the interconnect structure to electrically connect the top die and the circuit substrate.

5. The package structure of claim 4, wherein the photonic transmission structure comprises a waveguide extending along a first direction,
    the dam structure comprises a plurality of strip structures arranged alternately along the first direction and extending along a second direction perpendicular to the first direction,
    wherein a vertical projection of the waveguide at least partially overlaps with a vertical projection of the dam structure.

6. The package structure of claim 5, wherein the vertical projection of the waveguide has a tip at least penetrating one of vertical projections of the plurality of the strip structures.

7. The package structure of claim 4, wherein the photonic transmission structure comprises a waveguide extending along a first direction,
    the dam structure comprises a C-shaped structure, a notch of the C-shaped structure faces the plurality of the conductive pads,
    wherein a vertical projection of the waveguide has a tip surrounded by a vertical projection of the dam structure.

8. The package structure of claim 4, wherein the photonic transmission structure comprises a waveguide extending along a first direction,
    the plurality of conductive pads are arranged in a C-shape, a notch of the C-shape faces the first sidewall of the bottom die,
    the dam structure is located within a recess of the C-shape, the dam structure comprises a plurality of strip structures arranged alternately along the first direction and extending along a second direction perpendicular to the first direction,
    wherein a vertical projection of the waveguide at least partially overlaps with a vertical projection of the dam structure.

9. The package structure of claim 1, further comprising a plurality of conductive pads disposed on the back side of the bottom die, wherein the plurality of conductive pads and the dam structure are at a same level, and the dam structure is electrically isolated from the plurality of conductive pads by the underfill.

10. A method, comprising:
    face-to-face bonding a top die with a bottom die;
    forming a conductive layer on the back side of the bottom die, wherein the conductive layer comprises a plurality of conductive pads and a dam structure formed between the plurality of conductive pads and a first sidewall of the bottom die;
    bonding a circuit substrate on the back side of the bottom die through a plurality of connectors and the plurality of conductive pads connecting to each other; and
    dispensing an underfill at a second sidewall of the bottom die that is opposite to the first sidewall to laterally encapsulate the plurality of connectors, the plurality of conductive pads, and the dam structure, wherein the dam structure is electrically isolated from the circuit substrate by the underfill.

11. The method of claim 10, wherein the providing the bottom die comprises:
    providing a substrate having a first surface and a second surface opposite to each other;
    forming a photonic transmission structure on the first surface of the substrate;
    forming a first interconnect structure on the photonic transmission structure;
    forming an opening in the substrate, the photonic transmission structure, and the interconnect structure; and
    filling a conductive material in the opening to form a through substrate via (TSV).

12. The method of claim 11, further comprising:
    forming an insulating layer to laterally encapsulate the top die;
    grinding the substrate to reveal the TSV; and
    forming a second interconnect structure on the second surface of the substrate to contact with the TSV.

13. The method of claim 12, wherein the forming the insulating layer comprises:
    forming an insulating material on the front side of the bottom die to cover a sidewall and a back side of the top die; and
    performing a planarization process on the insulating material to expose the back side of the top die.

14. The method of claim 11, wherein the forming the photonic transmission structure comprises:
    forming a silicon layer on the first surface of the substrate;
    patterning the silicon layer to form a waveguide extending along a first direction; and
    forming a protection layer to laterally encapsulate a sidewall of the waveguide, wherein the protection layer has a sidewall aligned with the first sidewall of the bottom die.

15. The method of claim 14, wherein the patterning the silicon layer comprises forming a coupler disposed between the first sidewall of the bottom die and the waveguide, and optically coupled to an optical fiber.

16. The method of claim 10, wherein the face-to-face bonding the top die with the bottom die comprises:
    turning the top die upside down, so that a front side of the top die faces toward the front side of the bottom die; and
    directly contacting an interconnect structure of the top die to an interconnect structure of the bottom die, so that the top die and the bottom die are face-to-face bonded together.

17. A package structure, comprising:
    a bottom die, having a front side and a back side opposite to each other;
    a top die, bonding on the front side of the bottom die;

an insulating layer, disposed on the front side of the bottom die to laterally encapsulate a sidewall of the top die;

a plurality of conductive pads, disposed on the back side of the bottom die, wherein the plurality of conductive pads are arranged in a C-shape to form a vacancy between the plurality of conductive pads and a first sidewall of the bottom die, wherein the vacancy is surrounded by the plurality of conductive pads and a notch of the C-shape faces the first sidewall of the bottom die;

a circuit substrate, bonding on the back side of the bottom die through a plurality of connectors and the plurality of conductive pads connecting to each other; and an underfill, laterally encapsulating the plurality of connectors and the plurality of conductive pads, wherein the underfill fills in the vacancy so that no conductive element is formed in the vacancy.

18. The package structure of claim 17, wherein the bottom die comprises a waveguide extending along a direction from the second sidewall toward the first sidewall, a vertical projection of the waveguide has a tip, and the tip is within a recess of a vertical projection of the C-shape.

19. The package structure of claim 17, wherein an interconnect structure of the top die is in direct contact with an interconnect structure of the bottom die, so that the top die and the bottom die are face-to-face bonded together.

20. The package structure of claim 17, wherein the underfill at the first sidewall of the photonic die has a first height, the underfill at a second sidewall of the photonic die opposite to the first sidewall has a second height, and the first height is lower than the second height.

* * * * *